(12) United States Patent
Furuie et al.

(10) Patent No.: US 8,766,881 B2
(45) Date of Patent: Jul. 1, 2014

(54) ORGANIC EL DISPLAY DEVICE

(75) Inventors: Masamitsu Furuie, Mobara (JP);
Hajime Akimoto, Kokubunji (JP)

(73) Assignees: Japan Display Inc., Tokyo (JP);
Panasonic Liquid Crystal Display Co., Ltd., Hyogo-ken (JP)

( * ) Notice: Subject to any disclaimer, the term of this patent is extended or adjusted under 35 U.S.C. 154(b) by 979 days.

(21) Appl. No.: 12/078,687

(22) Filed: Apr. 3, 2008

(65) Prior Publication Data
US 2008/0258626 A1 Oct. 23, 2008

(30) Foreign Application Priority Data
Apr. 18, 2007 (JP) .................................. 2007-109590

(51) Int. Cl.
G09G 3/30 (2006.01)

(52) U.S. Cl.
USPC .................................. 345/51; 345/45; 345/76

(58) Field of Classification Search
USPC .......................................................... 315/35
See application file for complete search history.

(56) References Cited

U.S. PATENT DOCUMENTS

| 6,094,243 | A  | * | 7/2000  | Yasunishi | ......................... | 349/33 |
| 6,876,345 | B2 |   | 4/2005  | Akimoto et al. | | |
| 6,909,409 | B2 | * | 6/2005  | Tanada | ............................ | 345/51 |
| 2003/0058229 | A1 | * | 3/2003 | Kawabe et al. | ................ | 345/204 |
| 2003/0107560 | A1 | * | 6/2003 | Yumoto et al. | ................. | 345/204 |
| 2005/0116907 | A1 | * | 6/2005 | Miyazawa | ........................ | 345/76 |
| 2005/0237286 | A1 | * | 10/2005 | Tanada | ............................. | 345/77 |
| 2005/0264497 | A1 | * | 12/2005 | Shin et al. | ......................... | 345/76 |
| 2006/0114193 | A1 | * | 6/2006 | Kwak et al. | ..................... | 345/76 |
| 2006/0145964 | A1 |   | 7/2006 | Park et al. | | |

FOREIGN PATENT DOCUMENTS

| JP | 2003-5709 | 6/2001 |
| JP | 2005-338766 | 12/2005 |
| JP | 2006-189756 | 7/2006 |

* cited by examiner

Primary Examiner — Quan-Zhen Wang
Assistant Examiner — David Lee
(74) Attorney, Agent, or Firm — Juan Carlos A. Marquez; Morris, Martin & Manning, LLP

(57) ABSTRACT

The present invention allows an organic EL display device to perform display with high definition by reducing an area of each pixel forming a display region of the display device. A drive TFT for driving an organic EL element, a storage capacitance connected with a gate of the drive TFT, and a switching TFT connected to a scanning line are used in common by pixels arranged adjacent to each other in the lateral direction and hence, areas occupied by these circuit elements per one pixel can be reduced whereby the pixel can be made small. Further, a data line for supplying a video signal and a power source line for supplying an electric current to the organic EL elements can be used in common by the pixels arranged adjacent to each other and hence, the number of data lines and the number of power source lines can be halved thus reducing an area of the pixel. Due to such a constitution, the present invention acquires an organic EL display device capable of performing display with high definition.

4 Claims, 7 Drawing Sheets

ORGANIC EL DISPLAY DEVICE

CROSS-REFERENCE TO RELATED APPLICATIONS

The disclosure of Japanese Patent Application No. 2007-109590 filed on 2007, Apr. 18 including the claims, the specification, the drawings and the abstract is incorporated herein by reference in its entirety.

BACKGROUND

1. Field of the Invention

The present invention relates to an organic EL display device, and more particularly to a technique which achieves the high definition of a display screen by reducing a size of each pixel.

2. Description of Related Art

Conventionally, a main stream of a display device has been a cathode ray tube. However, a liquid crystal display device, a plasma display device or the like which constitutes a flat display device has been put into practice replacing such a cathode ray tube, and a demand for the latter display devices is increasing. In addition to these display devices, the development and efforts for practical use of a display device using organic electro luminescence (hereinafter, referred to as an organic EL display device), and a display device which forms an image by arranging electron sources using field emission in a matrix array and by making phosphors arranged on an anode emit light (hereinafter, referred to as an FED display device) have been also in progress.

The organic EL display device possesses many advantageous features including following features.

(1) The organic EL display device is a self-luminous-type display device different from a liquid crystal display device and hence, the organic EL display device requires no backlight.

(2) A voltage necessary for emission of light is low, that is, 10V or less and hence, the power consumption can be reduced.

(3) The organic EL display device requires no vacuum structure different from the plasma display device and the FED display device and hence, the organic EL display device is suitable for achieving the reduction of weight and the reduction of thickness.

(4) A response time is short, that is, several microseconds and hence, the organic EL display device exhibits the excellent moving image characteristic.

(5) The organic EL display device possesses a wide viewing angle of 170° or more.

In the organic EL display device, an organic EL layer is formed for every pixel, and an electric current which flows in the organic EL layer is controlled by a pixel circuit. The pixel circuit requires a plurality of thin film transistors (TFT) for controlling the electric current which flows in the organic EL layer, a storage capacitance and the like. Such thin film transistors TFT include a drive TFT for controlling an electric current which flows in the organic EL layer, a switching TFT and the like. Further, the thin film transistors TFT exhibit large irregularities in threshold voltage due to irregularities in a manufacturing step thereof. When the irregularities in threshold voltage of the thin film transistor TFT is large, it is impossible to perform an accurate gray-scale control of an image. Another thin film transistor or the like becomes necessary for suppressing the irregularities of the threshold voltage of the thin film transistor TFT. In this manner, each pixel of the organic EL display device requires a large number of circuit elements therein.

The above-mentioned drive circuit is disclosed in U.S. Pat. No. 6,876,345 (patent document 1), for example.

SUMMARY

When a large number of circuit elements is present in the pixel as described above, the reduction of a size of the pixel is limited. When the reduction of the size of the pixel is not realized, it is difficult to form a high-definition screen. This drawback becomes particularly critical with respect to a miniaturized organic EL display device.

Further, the organic EL display device requires current supply lines for supplying an electric current to the organic EL layers besides scanning lines and data signal lines. The presence of the current supply lines is disadvantageous for the pixel to ensure an enough area.

In a so-called bottom-emission type organic EL display device which is currently under development, light cannot be taken out to the outside from portions where pixel drive circuits, power source lines and the like are present and hence, the drawback that a light emission area is limited by the pixel circuits or the like becomes more critical.

The present invention has been made to overcome the above-mentioned drawback, and it is an object of the present invention to provide an organic EL display device which can reduce an area per one pixel by decreasing an area occupied by a pixel of a pixel circuit due to the common use of a drive TFT, a switching TFT, a storage capacitance and the like by two pixels. Further, according to one aspect of the present invention, due to the common use of a data line or a power source line by two pixels, it is possible to reduce an area occupied by the data line or a power source line in a display region. Further, according to another aspect of the present invention, by the common use of one scanning line by two pixels, an area occupied by a scanning line in the display region can be reduced. Main specific constitutions of the organic EL display device of the present invention are as follows.

(1) In an organic EL display device in which pixels each having an organic EL element are formed in a matrix array, a drive TFT for controlling a quantity of electric current which flows in the organic EL element is used in common by the two pixels.

(2) In the organic EL display device having the constitution (1), a switching TFT which is connected with a scanning line and fetches a video signal in the pixel in response to a scanning signal from the scanning line and a storage capacitance which is connected with a gate of the drive TFT and stores a charge in response to a video signal are used in common by the two pixels.

(3) In the organic EL display device having the constitution (1), the two pixels are arranged adjacent to each other in the lateral direction.

(4) In the organic EL display device having the constitution (1), an N-type light emission control TFT which determines whether or not an electric current from the drive TFT is made to flow in the organic EL element is formed between the drive TFT and the organic EL element with respect to one pixel out of the two pixels, and a P-type light emission control TFT which determines whether or not an electric current from the drive TFT is made to flow in the organic EL element is formed between the drive TFT and the organic EL element with respect to another pixel out of the two pixels.

(5) In the organic EL display device having the constitution (1), the two pixels are arranged adjacent to each other in the longitudinal direction.

(6) In the organic EL display device having the constitution (1), a light emission control TFT which determines whether or not an electric current from the drive TFT is made to flow in the organic EL element is formed between the drive TFT and the organic EL element with respect to the two pixels.

(7) In the organic EL display device having the constitution (6), the light emission control TFT is an N-type TFT.

(8) In the organic EL display device having the constitution (6), the light emission control TFT is a P-type TFT.

(9) In an organic EL display device in which in a display region in which pixels each having an organic EL element are formed in a matrix array, scanning lines for supplying a scanning signal extend in the horizontal direction, and data lines for supplying a video signal and a power source line for supplying an electric current to the organic EL elements extend in the vertical direction, the data line and the power source line are used in common by the pixels arranged adjacent to each other in the lateral direction.

(10) In the organic EL display device having the constitution (9), the pixels arranged adjacent to each other in the lateral direction use a switching TFT for fetching the video signal into the pixel in response to the scanning signal in common.

(11) In the organic EL display device having the constitution (10), the pixels arranged adjacent to each other in the lateral direction use a drive TFT for controlling a quantity of electric current which is made to flow in the organic EL element and a storage capacitance connected with a gate of the drive TFT and storing a charge therein in response to the video signal in common.

(12) In the organic EL display device having the constitution (9), the display device includes a data signal drive circuit for outputting the video signal to the outside of the display region, data signal lines the number of which corresponds to the number of pixels in the horizontal direction in the display region extend from the data signal drive circuit, and the number of the data lines for transmitting the video signal in the display region is half of the number of the data signal lines in the display region.

(13) In the organic EL display device having the constitution (9), the scanning lines are selected twice in one frame.

(14) In an organic EL display device in which in a display region in which pixels each having an organic EL element are formed in a matrix array, scanning lines for supplying a scanning signal extend in the horizontal direction, and data lines for supplying a video signal and a power source line for supplying an electric current to the organic EL elements extend in the vertical direction, the scanning lines are used in common by the pixels arranged adjacent to each other in the longitudinal direction.

(15) In the organic EL display device having the constitution (14), the number of scanning lines is half of the number of pixels in the longitudinal direction in the display region.

(16) In the organic EL display device having the constitution (14), the scanning lines are scanned twice in one frame.

(17) In the organic EL display device having the constitution (14), the organic EL elements emit lights of different colors for the respective pixels and the power source lines connected with the organic EL elements are respectively connected to different power sources for respective organic EL elements which emit lights of different colors.

(18) In an organic EL display device including a first group of pixels each having an organic EL element and a second group of pixels each having an organic EL element, the first group of pixels is driven in a former half period of one frame and the second group of pixels is driven in a latter half period of one frame.

(19) In the organic EL display device having the constitution (18), the scanning lines which select the pixels belonging to the first group of pixels and the pixels belonging to the second group of pixels are selected twice in one frame.

(20) In the organic EL display device having the constitution (18), the pixels belonging to the first group of pixels and the pixels belonging to the second group of pixels are arranged adjacent to each other in the lateral direction.

(21) In the organic EL display device having the constitution (20), the data lines which supply a video data to the first group of pixels and the second group of pixels are used in common by the pixels belonging to the first group of pixels and the pixels belonging to the second group of pixels.

(22) In the organic EL display device having the constitution (18), the pixels belonging to the first group of pixels and the pixels belonging to the second group of pixels are arranged adjacent to each other in the longitudinal direction.

(23) In the organic EL display device having the constitution (22), the scanning lines which supply a scanning signal to the first group of pixels and the second group of pixels are used in common by the pixels belonging to the first group of pixels and the pixels belonging to the second group of pixels.

As described above, the drive TFT, the switching TFT, the storage capacitance and the like are used in common by two pixels or a plurality of pixels and hence, a rate of area for these circuit elements per one pixel can be reduced whereby an area of the pixel can be decreased thus realizing a high-definition screen.

When the drive TFT, the switching TFT, the storage capacitance and the like are used in common by the pixels arranged adjacent to each other in the lateral direction, the number of data lines for supplying the video signal and the number of power source lines for supplying an electric current to the organic EL elements can be halved compared to a conventional example and hence, the pixel area can be also reduced from this aspect.

When the drive TFT, the switching TFT, the storage capacitance and the like are used in common by the pixels arranged adjacent to each other in the longitudinal direction, the number of scanning lines can be halved compared to a conventional example and hence, the pixel area can be also reduced from this aspect.

The above-mentioned constitution is particularly effective in a bottom-emission-type organic EL display device which has been developed currently.

DETAILED DESCRIPTION OF THE INVENTION

The present invention is explained in detail in conjunction with embodiments.

First Embodiment

Figure 1:
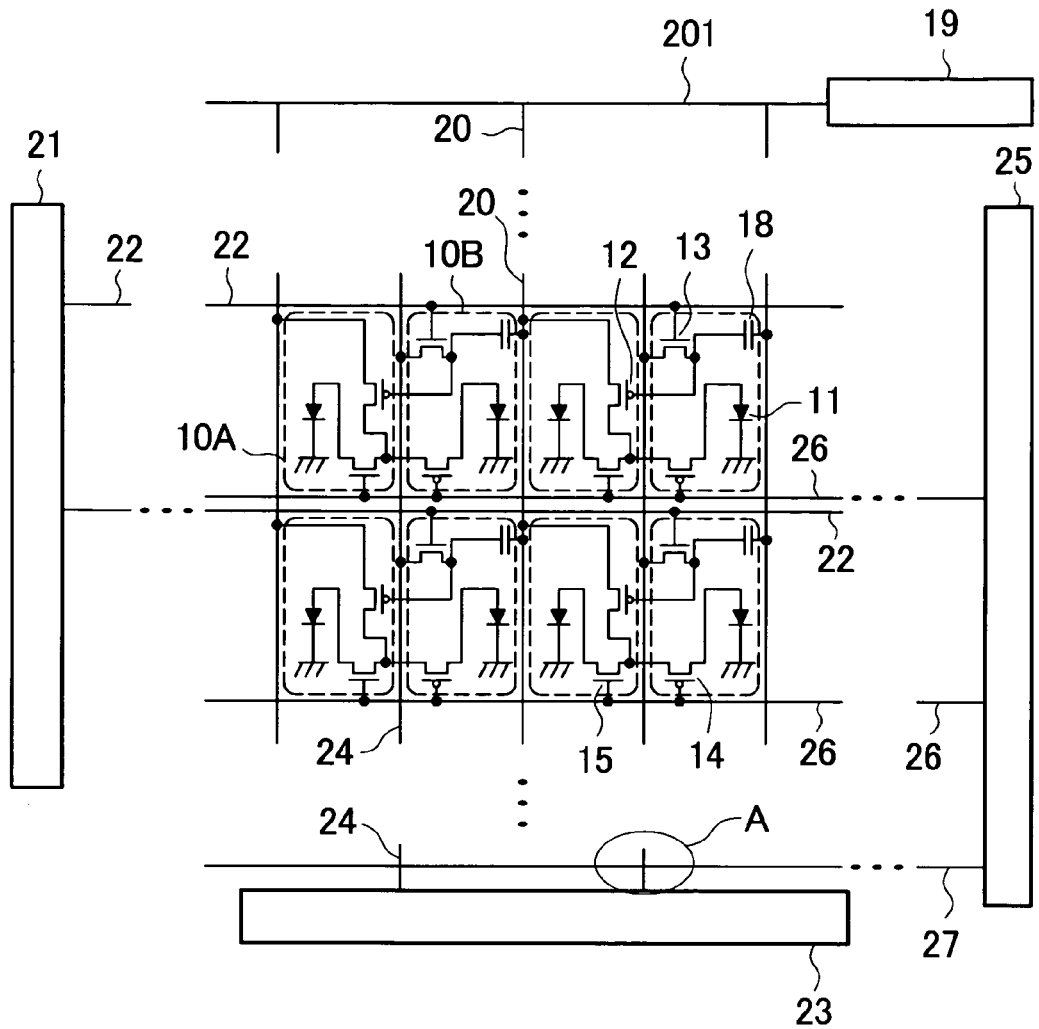
FIG. 1 is a circuit diagram of an organic EL display device according to a first embodiment of the present invention.

FIG. 1 is a circuit diagram showing an organic EL display device according to the first embodiment of the present invention. In FIG. 1, a portion surrounded by a dotted line indicates a pixel 10. The pixels 10 are arranged in the longitudinal direction as well as in the lateral direction in a matrix array to form a display region. An organic EL element 11 is formed in the pixel, and an image is formed by emission of light from the organic EL element 11 in each pixel. The organic EL elements 11 of the same color are formed in the pixels 10 arranged in the longitudinal direction.

A scanning signal drive circuit 21 is arranged on a left side of the display region shown in FIG. 1, and a large number of scanning lines 22 extends to the inside of the display region from the scanning signal drive circuit 21 in the horizontal direction. A data signal drive circuit 23 is arranged on a lower side of the display region, and data lines 24 extend to the inside of the display region from the data signal drive circuit 23 in the vertical direction. A power source mother line 201 for supplying an electric current to the organic EL element 11 is formed above the display region, and power source lines 20 for supplying an electric current to the organic EL elements 11 extend downwardly from the power source mother line 201. An electric current is supplied to the power source mother line 201 from an organic-EL-element power source 19. A region surrounded by the data line 24, the power source line 20 and two scanning lines 22 forms the pixel 10.

The scanning line 22 is connected to gates of switching TFTs 13. When a scanning signal is set at a High level, the switching TFTs 13 are turned on, and a data signal is written in the pixels 10 from the data line 24. This signal is stored in storage capacitances 18. One end of the storage capacitance 18 is connected to a gate of a drive TFT 12. A source of the drive TFT 12 is connected to the power source line 20. Then, due to a charge stored in the storage capacitance 18, an electric current which flows in the drive TFT 12 is controlled thus performing gray-scale display. A drain of the drive TFT 12 is connected to a source of a light emission control TFT 14 or 15. A gate of the light emission control TFT 14 or 15 is connected to a light emission control line which extends from a light emission control circuit 25, while a drain of the light emission control TFT 14 or 15 is connected to an anode of the organic EL element 11. An electric current which flows in the organic EL element 11 flows toward a cathode indicated by a ground symbol in FIG. 1 from an anode so as to allow the organic EL element 11 to emit light. In response to a signal on a light emission control line 26 which extends from the light emission control circuit 25, the light emission control TFT 14 or 15 is controlled so as to determine whether or not an electric current is made to flow into the organic EL element 11.

The present invention is characterized in that the drive circuit is used in common by the pixels 10 arranged adjacent to each other in the horizontal direction. In the pixel 10A shown in FIG. 1, the drive TFT 12 and the in-pixel N-type light-emission-control TFT 15 are arranged besides the organic EL element 11. In the pixel 10B, the switching TFT 13, the storage capacitance 18 and the in-pixel P-type light-emission-control TFT 14 are arranged besides the organic EL element 11. In the conventional example, the drive TFT 12, the storage capacitance 18 and the switching TFT 13 are arranged for every pixel and hence, it is necessary to ensure an area occupied by these elements in the pixel whereby it is difficult to set an area of the pixel to a fixed value or less. To the contrary, according to this embodiment, these elements are shared by two pixels and hence, the area of the pixel 10 can be reduced.

Figure 2:
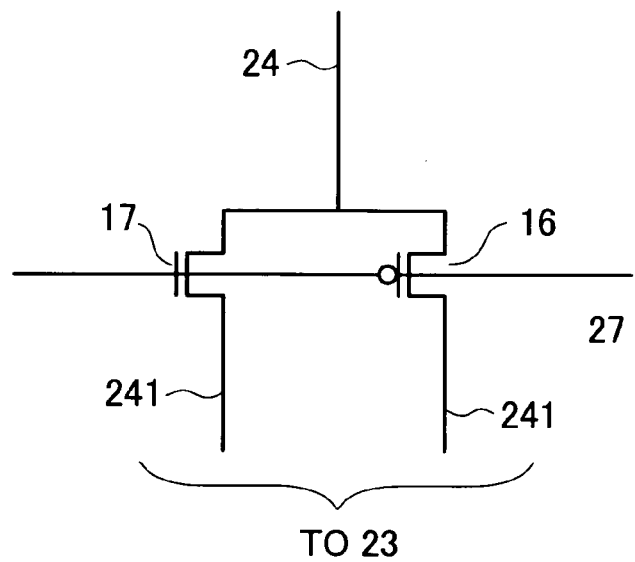
FIG. 2 is a detailed view of a portion A in FIG. 1.

To form an image with such pixel constitution, it is necessary to modify the manner of operation. FIG. 2 is a detailed view of a portion A in the vicinity of the data signal drive circuit 23 shown in FIG. 1. In FIG. 2, signal lines 241 the number of which corresponds to the number of pixels in the lateral direction extend from the data signal drive circuit 23, and the respective signal lines are connected to sources of the drive-circuit-side N-type light emission control TFT 17 or the drive-circuit-side P-type light emission control TFT 16 respectively. In response to a signal applied to a data-signal-drive circuit-side light emission control line 27, the drive-circuit-side N-type light emission control TFT 17 or the drive-circuit-side P-type light emission control TFT 16 is turned on, and a data signal of every one other signal line 241 is outputted to the data line 24.

In this case, when the data-signal-drive-circuit-side light emission control line 27 is at a High level, the drive-circuit-side N-type light emission control TFT 17 is turned on so that, for example, an odd-numbered data signal is outputted to the data line 24. When the data-signal-drive-circuit-side light emission control line 27 is at a Low level, the drive-circuit-side P-type light emission control TFT 16 is turned on so that, for example, an even-numbered data signal is outputted to the data line 24. Since the in-pixel N-type light emission control TFT 15 and the in-pixel P-type light emission control TFT 14 are alternately connected to the pixel-side light emission control line 26 for every neighboring pixel and hence, the in-pixel N-type light emission control TFT 15 and the in-pixel P-type light emission control TFT 14 are turned on and off in synchronism with the drive-circuit-side N-type light emission control TFT 17 and the drive-circuit-side P-type light emission control TFT 16. Accordingly, the neighboring pixels alternately emit light in response to the signal from the light emission control line 26 or 27.

Figure 3:
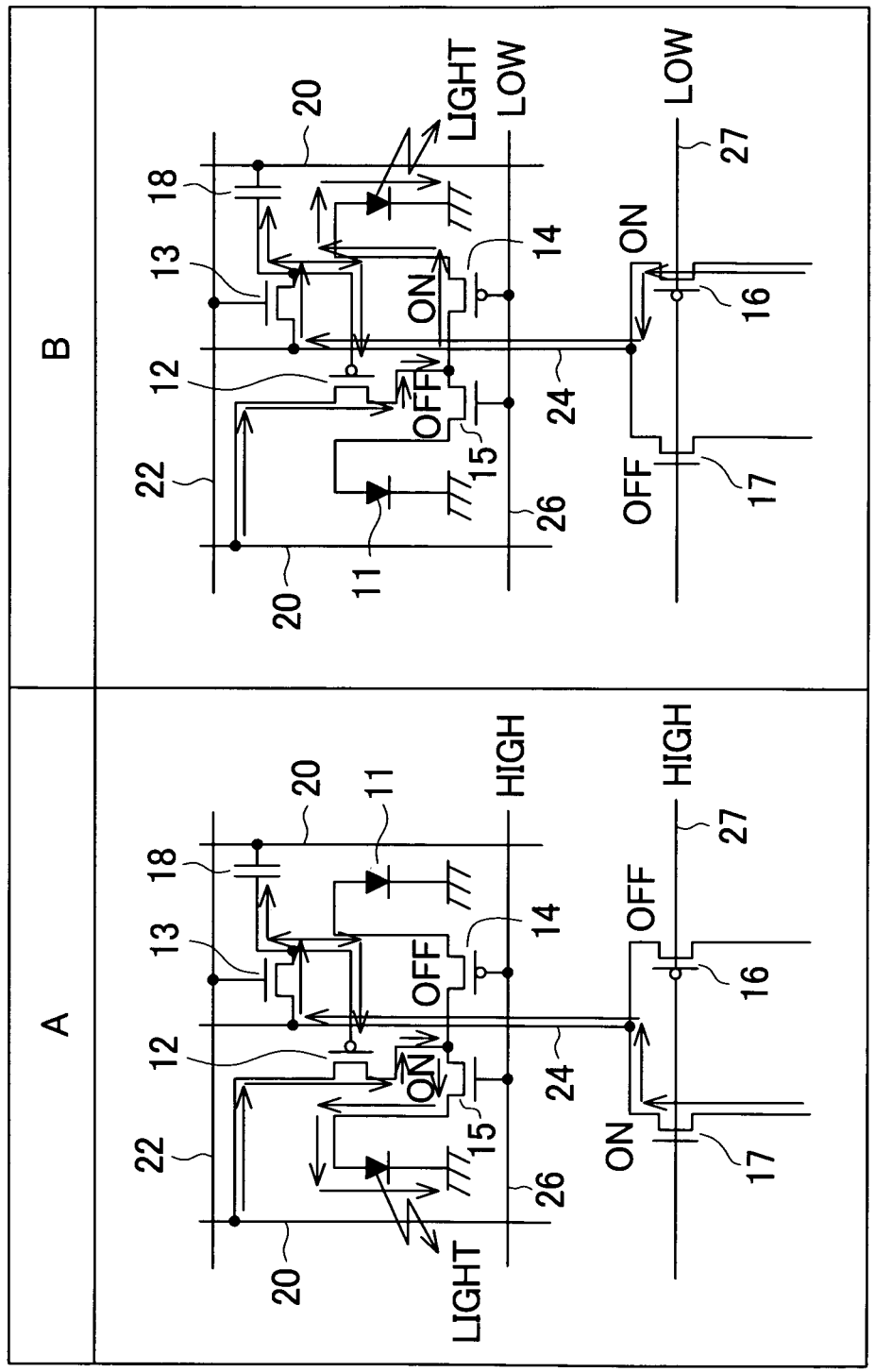
FIG. 3 is a circuit diagram showing an operation of the organic EL display device according to the first embodiment of the present invention.

FIG. 3 is an operational view showing the flow of the signal or the electric current in the first embodiment. A left side A in FIG. 3 shows the flow of the signal or the electric current when the light emission control line 26 or 27 is at a High level, and a right side B in FIG. 3 shows the flow of the signal or the electric current when the light emission control line 26 or 27 is at a Low level.

On the left side A in FIG. 3, assume that the scanning line 22 is at a High level, and the switching TFT 13 connected to the scanning line 22 is in an ON state. When the light emission control line 27 is at a High level in such a state, for example, the odd-numbered data signal on the left side flows into the pixel 10 via the drive-circuit-side N-type light emission control TFT 17. The even-numbered data does not flow into the pixel 10 since the drive-circuit-side P-type light emission control TFT 16 is turned off. The odd-numbered signal is stored in the storage capacitance 18 as a charge via the data line 24 and the switching TFT 13. Based on a potential of the charge stored in the storage capacitance 18, an electric current which is made to flow in the organic EL element 11 from the drive TFT 12 is determined.

The source of the drive TFT 12 is connected to the power source line 20 which supplies the electric current to the organic EL element 11, and the drain of the drive TFT 12 is connected to the in-pixel N-type light emission control TFT 15. Since the light emission control line 26 is at a High level at this point of time, the in-pixel N-type light emission control TFT 15 is turned on so that light is emitted from the odd-numbered organic EL element 11. On the other hand, the in-pixel P-type light emission control TFT 14 present in the even-numbered pixel 10 is the P-type TFT and hence, when the light emission control line 26 is at a High level, the in-pixel P-type light emission control TFT 14 assumes an OFF state so that the electric current does not flow into the even-numbered organic EL element 11.

The right side B in FIG. 3 shows the data signal and the electric current which flows in the organic EL element 11 when the light emission control lines 26, 27 are at a Low level. When the light emission control line 27 is at a Low level in such a state, for example, the even-numbered data signal on the right side flows into the pixel 10 via the drive-circuit-side P-type light emission control TFT 16. The odd-numbered data does not flow into the pixel 10 since the drive-circuit-side N-type light emission control TFT 17 is turned off. The even-numbered signal is stored in the storage capacitance 18 as a charge via the data line 24 and the switching TFT 13. Based on a potential of the charge stored in the storage capacitance 18, an electric current which is made to flow in the organic EL element 11 from the drive TFT 12 is determined.

The source of the drive TFT 12 is connected to the power source line 20 which supplies the electric current to the organic EL element 11, and the drain of the drive TFT 12 is connected to the in-pixel N-type light emission control TFT 15. Since the light emission control line 26 is at a Low level at this point of time, the in-pixel P-type light emission control TFT 14 is turned on so that light is emitted from the even-numbered organic EL element 11. On the other hand, the in-plane N-type light emission control TFT 15 present in the odd-numbered pixel 10 is the N-type TFT and hence, when the light emission control line 26 is at a Low level, the in-pixel N-type light emission control TFT 15 assumes an OFF state so that the electric current does not flow into the odd-numbered organic EL element 11.

As described above, it is determined whether the odd-numbered pixel 10 or the even-numbered pixel 10 emits light depending on whether the light emission control lines 26, 27 are at a High level or at a Low level. Then, whenever either one of these pixels 10 emits light, the drive TFT 12, the switching TFT 13, the storage capacitance 18 and the like are used in common. In this embodiment, one frame is divided in two and, for example, the light is emitted from the odd-numbered pixel 10 in a former half period and the light is emitted from the even-numbered pixel 10 in a latter half period thus forming a complete image within one frame.

Figures 4, 5:
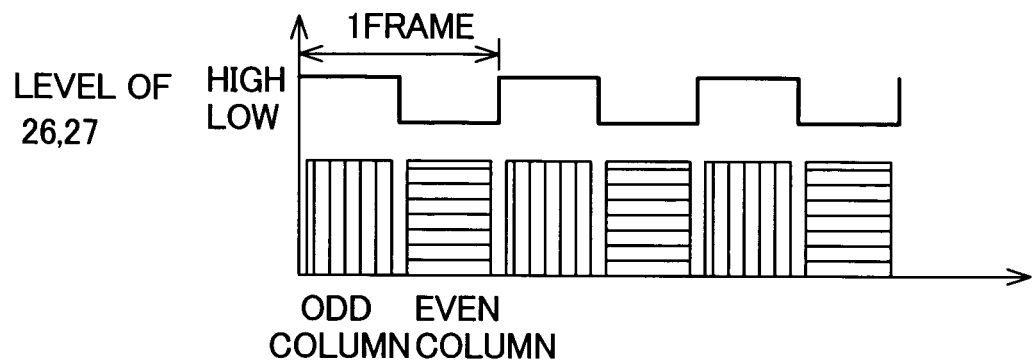
FIG. 4 is a schematic view showing an operation of the organic EL display device according to the first embodiment of the present invention.
FIG. 5 is a view showing an operation of every pixel of the organic EL display device according to the first embodiment of the present invention.

FIG. 4 briefly shows the above-mentioned content. In FIG. 4, within one frame, the light emission control line 26 is at a High level in a former half period and the light emission control line 26 is at a Low level in a latter half period. Then, the pixels 10 which are present in the odd-numbered rows emit light in the former half period of the frame, and the pixels 10 which are present in the even-numbered rows emit light in the latter half period of the frame.

Then, to perform color display, the organic EL elements 11 which emit lights of red, green and blue are allocated to the respective pixels for every row. Accordingly, the light of specific color is emitted for every row. This manner of operation is shown in FIG. 5. FIG. 5 shows how the pixels 10 indicated by Pixel emit light depending on levels of the light emission control lines 26, 27. Symbol A in FIG. 5 indicates a light emission state of the pixels 10 when the light emission control lines 26, 27 are at a High level. In this state, although the leftmost row of red pixels is in a light emission state, the row of green pixels next to the leftmost row of red pixels does not emit light. The row of blue pixels next to the row of green pixels emits light. Further, the row of red pixels next to the row of blue pixels does not emit light. Since a large number of pixels is present in the display region, white display is performed as a whole even only during the former half period of one frame.

Symbol B in FIG. 5 indicates a light emission state of the pixel 10 when the light emission control lines 26, 27 are at a Low level. In this state, contrary to the light emission state indicated by symbol A, the pixels which do not emit light when the light emission control lines 26, 27 are at a High level emit light, and the pixels which emit light when the light emission control lines 26, 27 are at a High level perform black display. Then, by allowing the light emission control lines 26, 27 to be at a High level and a Low level within one frame, all pixels emit light in response to the data signal within one frame.

Figure 6:
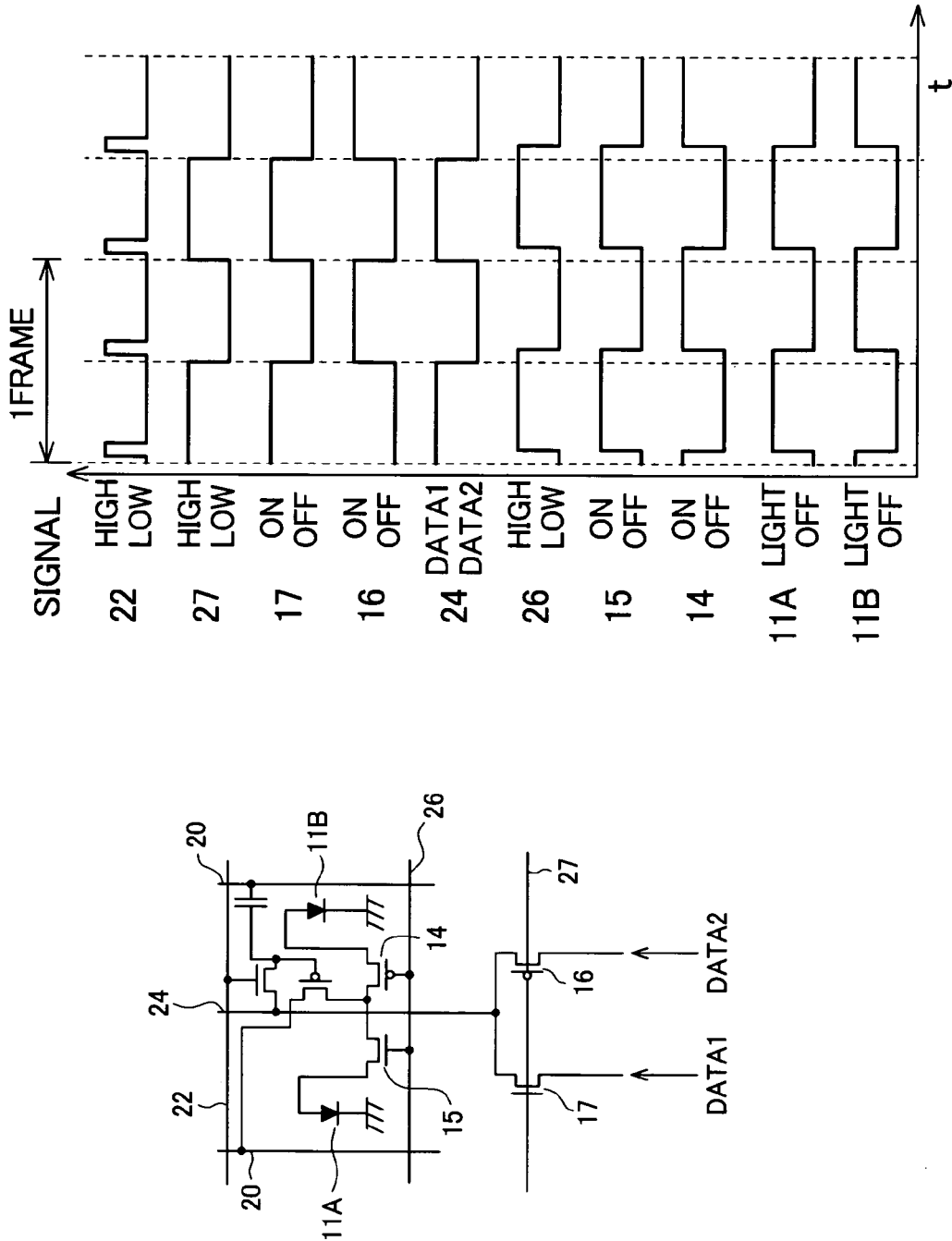
FIG. 6 is a timing chart of the organic EL display device according to the first embodiment of the present invention.

FIG. 6 shows a timing chart of the respective element in the pixel circuit. In FIG. 6, levels of the signals of the respective circuit elements are taken on an axis of ordinates, and time is taken on an axis of abscissas. One frame is formed of two periods each of which is defined between longitudinal dotted lines. FIG. 6 shows a state in which the pixels on a specified scanning line are selected in response to a pulse on the scanning line 22. In the former half period of one frame, the data-signal-drive-circuit-side light emission control line 27 is at a High level. In such a state, although the drive-circuit-side N-type light emission control TFT 17 is turned on, the drive-circuit-side P-type light emission control TFT 16 is turned off. Accordingly, a signal DATA1 flows in the data line 24.

The light emission control line 26 is set at a High level at timing that the scanning line 22 is set at a High level. Then, although the in-pixel N-type light emission control TFT 15 is turned on, the in-pixel P-type light emission control TFT 14 is turned off. Accordingly, the organic EL element 11A emits light in response to the signal DATA1.

In the latter half period of one frame, the same scanning line 22 is selected again. In the latter half period of one frame, the data-signal-drive-circuit-side light emission control line 27 is at a Low level. In such a state, although the drive-circuit-side N-type light emission control TFT 17 assumes an OFF state, the drive-circuit-side P-type light emission control TFT 16 assumes an ON state. Accordingly, a signal DATA2 flows in the data line 24.

The light emission control line 26 is set at a Low level at timing that the scanning line 22 is set at a Low level. Then, although the in-pixel N-type light emission control TFT 15 assumes an OFF state, the in-pixel P-type light emission control TFT 14 assumes an ON state. Accordingly, the organic EL element 11B emits light in response to the signal DATA2.

As described above, the drive TFT 12, the switching TFT 13, the storage capacitance 18 and the like are used in common by the pixels arranged adjacent to each other in this embodiment and hence, areas occupied by these elements in the pixel can be reduced whereby the area of the pixel can be reduced thus realizing the display with high definition. Further, the number of data lines 24 and the number of power source lines 20 can be set to one half of the number of data lines and the number of power source lines of the conventional display device thus realizing the display with higher definition.

In this embodiment, one frame is divided into a former half period and a latter half period, and the display with high definition can be realized by allowing the pixels 10 on the odd-numbered row and the pixels 10 on the even-numbered row to emit light alternately between the former half period and the latter half period. Although the brightness is halved compared to the brightness obtained by a case in which each pixel is allowed to emit light for the full one frame, the lack of the brightness is compensated by increasing a quantity of electric current which is made to flow in the organic EL element 11 during the light emission period corresponding to the lack of brightness. Even when the quantity of electric current which flows during the light emission period is increased, the electric current does not flow in the organic EL element 11 during one half of one frame and hence, there is no possibility that a lifetime of the organic EL element 11 is shortened.

In explaining the first embodiment, the explanation is made with respect to the case in which the drive TFT 12, the switching TFT 13, the storage capacitance 18 and the like are used in common by two pixels arranged adjacent to each other in the lateral direction. The same idea is applicable to a case in which these elements are used in common by three or more pixels arranged adjacent to each other in the lateral direction. When these elements are used in common by three or more pixels arranged in the lateral direction, these pixels do not share only one light emission control line 26 connected to the light emission control TFT 14 or 15, but use the number of light emission control lines 26, the number of light emission control TFTs 14 or 15 corresponding to the number of pixels which use elements in common. In this case, in one frame, the respective scanning lines are selected corresponding to the number of pixels which use elements in common.

Second Embodiment

Figure 7:
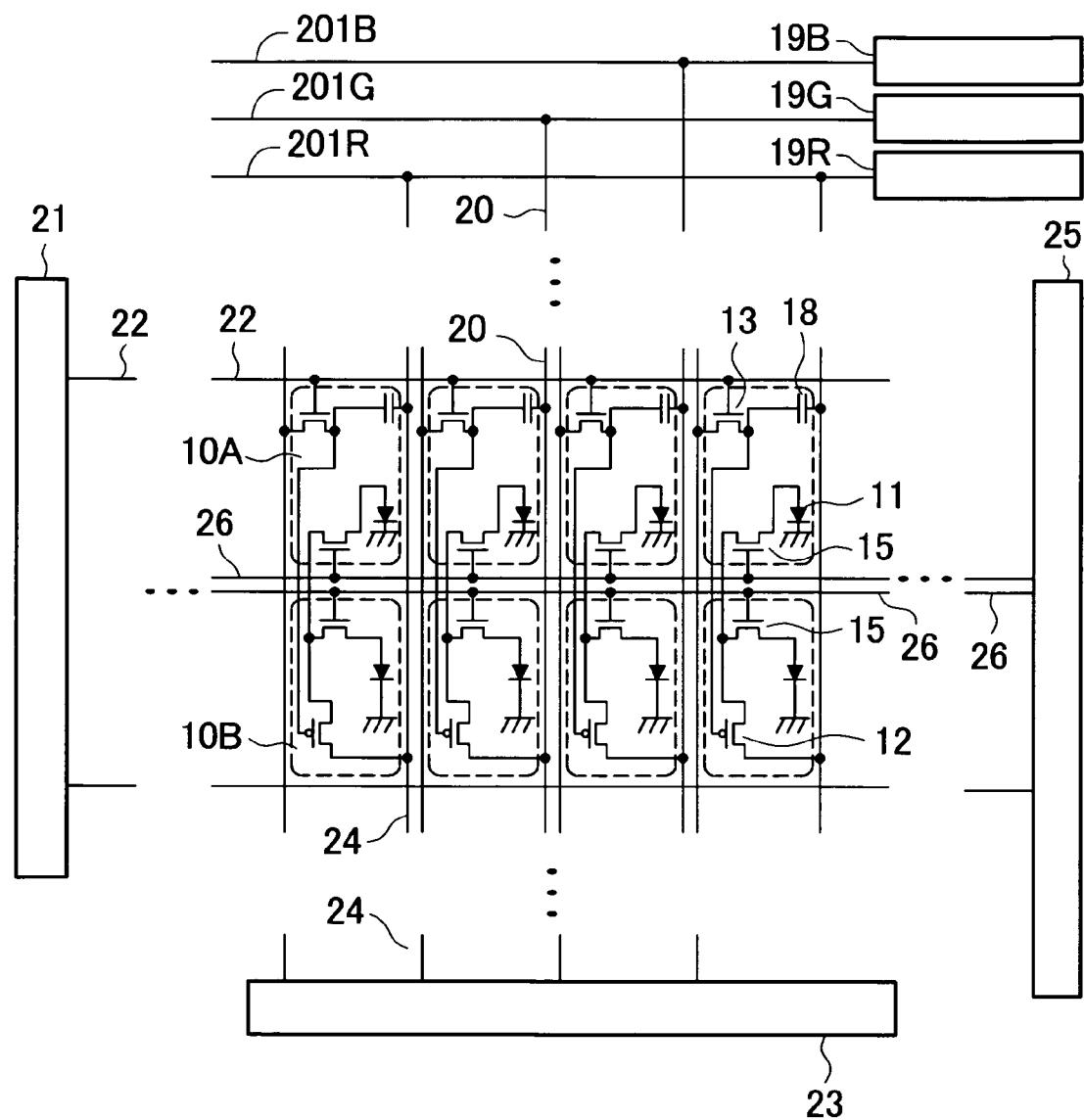
FIG. 7 is a circuit diagram of an organic EL display device according to a second embodiment of the present invention.

FIG. 7 is a circuit diagram of an organic EL display device of the second embodiment of the present invention. The second embodiment is characterized in that a drive TFT 12, a switching TFT 13, a storage capacitance 18 and the like are used in common by pixels 10 arranged adjacent to each other in the longitudinal direction. In FIG. 7, in the same manner as the embodiment 1 shown in FIG. 1, a scanning signal drive circuit 21 is arranged on a left side of a display region, scanning lines 22 extend over the display region from the scanning signal drive circuit 21, a light emission control circuit 25 is arranged on a right side of the display region, and light emission control lines 26 extend over the display region. A data signal drive circuit 23 is arranged on a lower side of the display region and data lines 24 extend over the display region.

In FIG. 7, the data-signal-drive-circuit-side light emission control line 27, the drive-circuit-side P-type light emission control TFT 16, the drive-circuit-side N-type light emission control TFT 17 and the like arranged in the vicinity of the data signal drive circuit 23 which are present in FIG. 1 are not present in this embodiment. Data lines 24 from the data signal drive circuit 23 directly correspond to all pixels respectively. Power source lines 20 from organic EL element power sources 19 also correspond to all pixels respectively. In this embodiment, it is necessary to provide the power source lines 20 and the data lines 24 the number of which is equal to the number of the pixels and hence, the number of the power source lines 20 and the number of the data lines 24 are equal to the corresponding numbers of power source lines and data lines of a conventional display device and are twice as large as the corresponding numbers of power source lines and data lines of the display device of the first embodiment.

In this embodiment, since the number of the power source lines 20 is equal to the number of pixels 10 arranged in the horizontal direction and hence, the organic EL element power sources 19 can be formed for respective colors. The organic EL elements 11 differ in characteristic from each other depending on materials of light emission color and hence, the display of this embodiment acquires an advantage that the degree of freedom in designing is increased by providing the power sources for respective colors.

In FIG. 7, a switching TFT 13, a storage capacitance 18, an in-pixel N-type light emission control TFT 15 and an organic EL element 11 are arranged in the pixel 10A, while a drive TFT 12, an in-pixel N-type light emission control TFT 15 and an organic EL element 11 are arranged in the pixel 10B. The drive TFT 12, the switching TFT 13 and the storage capacitance 18 are used in common by two pixels arranged in the longitudinal direction.

This embodiment shown in FIG. 7 differs from the embodiment shown in FIG. 1 with respect to the structure that the scanning signal lines 22 are arranged for every one other line in the longitudinal direction and hence, the number of scanning lines is one half of the number of scanning lines of the embodiment shown in FIG. 1. On the other hand, the light emission control lines 15 are arranged for every pixel in the longitudinal direction. This is because the light emission control TFTs 15 are formed using only an N-type TFT 15. Accordingly, the number of lines in the horizontal direction is as same as the number of lines in the horizontal direction in the embodiment shown in FIG. 1. Although the light emission control TFTs are formed using only the N-type TFT in FIG. 7, the light emission control TFTs may be formed using only a P-type TFT. Further, as in the case of the embodiment shown in FIG. 1, the number of light emission control lines 26 may be reduced by using both of the N-type TFTs and the P-type TFTs.

Also in this embodiment, one frame is divided into a former half period and a latter half period. Then, for example, the pixel 10A is allowed to emit light in the former half period of the frame and the pixel 10B is allowed to emit light in the latter half period of the frame. In FIG. 7, when the scanning line 22 is set at a High level, the pixels 10A and 10B arranged adjacent to each other in the longitudinal direction are simultaneously selected. Then, a video signal is stored in the storage capacitance 18 as a charge through the data line 24. The drive TFT 12 is driven in response to a potential based on the charge stored in the storage capacitance 18.

In the former half period of one frame, the light emission control line 26 corresponding to the pixel 10A is set at a High level and the light emission control line 26 corresponding to the pixel 10B is set at a Low level. Then, the organic EL element 11 in the pixel 10A emits light in response to a video signal by the drive TFT 12. On the other hand, since an in-pixel N-type light emission control TFT 15 assumes an OFF state, an electric current does not flow in the organic EL element 11 in the pixel 10B so that the organic EL element 11 does not emit light.

In the latter half period of one frame, the light emission control line 26 corresponding to the pixel 10B is set at a High level, and the light emission control line 26 corresponding to the pixel 10A is set at a Low level. Then, the organic EL element 11 in the pixel 10B emits light in response to a video signal by the drive TFT 12. On the other hand, since an in-pixel N-type light emission control TFT 15 assumes an OFF state, an electric current does not flow in the organic EL element 11 in the pixel 10A so that the organic EL element 11 does not emit light.

In this manner, all pixels 10 are allowed to emit light in response to the video signals in one frame to form an image. Although the scanning lines 22 are selected twice in one frame, the number of the scanning lines 22 is one half of the number of the scanning lines 22 of the conventional display device and hence, the frequency of the scanning signal is equal to the frequency of the scanning signal used in the conventional display device.

As described above, according to this embodiment, the drive TFT 12, the switching TFT 13 and the storage capacitance 18 are used in common by the two pixels arranged in the longitudinal direction and hence, are as of the respective pixels can be reduced thus enabling the formation of a screen of high definition. Further, the organic EL element power sources 19 can be formed for respective colors and hence, the degree of freedom in designing and the lifetime property can be enhanced.

In the above-mentioned explanation, the explanation is made with respect to the case in which the drive TFT 12, the switching TFT 13, the storage capacitance 18 and the like are used in common by two pixels arranged adjacent to each other in the longitudinal direction. The same idea is applicable to a case in which these elements are used in common by three or more pixels arranged adjacent to each other in the longitudinal direction. When these elements are used in common by three or more pixels arranged in the longitudinal direction, these pixels may use the number of light emission control lines 26 and the number of light emission control TFTs 14 or 15 corresponding to the number of pixels which use elements in common. In this case, in one frame, the scanning lines are selected corresponding to the number of pixels which use elements in common.

Third Embodiment

In the first embodiment and the second embodiment, the explanation has been made with respect to the case in which the present invention is applied to the most basic pixel circuit of the organic EL display device. The present invention is, however, also applicable to an organic EL display device having a pixel circuit on which various modifications are made in addition to the organic EL display device having the basic pixel circuit.

Figure 8:
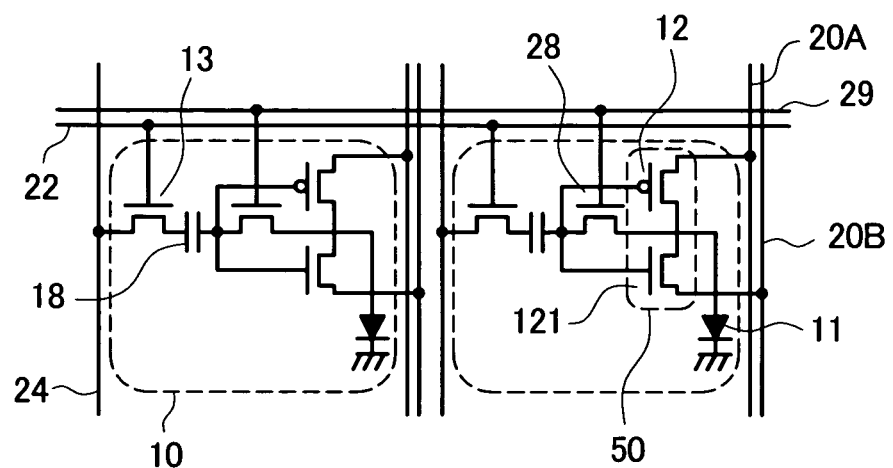
FIG. 8 is a circuit diagram of a conventional organic EL display device to which an organic EL display device of a third embodiment is applied.

For example, in the drive TFT 12 for driving the organic EL element 11, a threshold voltage fluctuates, and the fluctuation of the threshold voltage makes gray-scale display by the organic EL element 11 difficult. FIG. 8 shows an example of a circuit which copes with the fluctuation of the threshold voltage of the drive TFT 12. Since the circuit is disclosed in patent document 1, the detailed explanation of the circuit is omitted. The technical feature of the circuit shown in FIG. 8 is as follows. The switching TFT 13 is turned on by setting the scanning line 22 at a High level and, at the same time, a reset TFT 28 is turned on by setting a reset line 29 at a High level. An inverter 50 is formed of a drive TFT 12 and the inverter forming TFT 121. When the reset TFT 28 is turned on, a terminal of the storage capacitance 18 connected to a gate of the drive TFT 12 is forcibly set to a middle point of the inverter 50. Accordingly, the fluctuation of the threshold voltage of the drive TFT 12 can be canceled.

Figure 9:
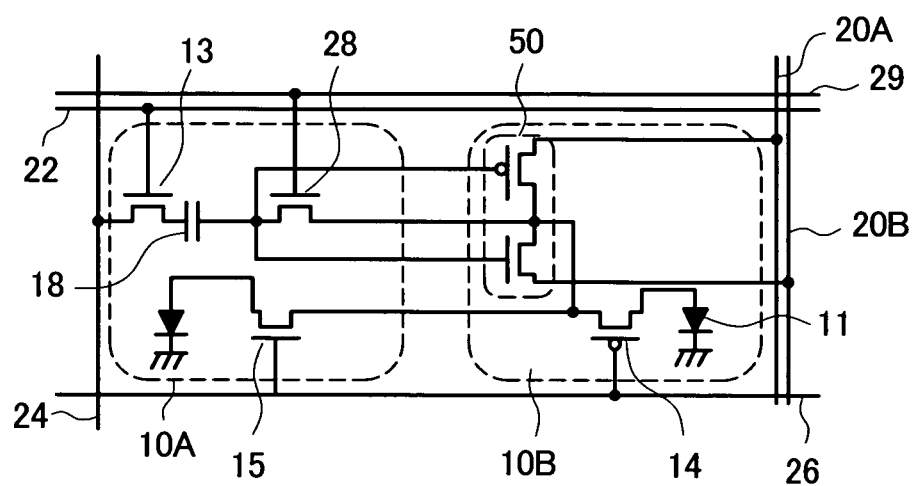
FIG. 9 is a circuit diagram showing of an organic EL display device of the third embodiment.

FIG. 9 shows an example in which the present invention is applied to the circuit shown in FIG. 8. In FIG. 9, the switching TFT 13, the storage capacitance 18, the reset TFT 28, and the inverter 50 including two TFTs are used in common by two pixels 10A, 10B arranged adjacent to each other. In FIG. 9, although an organic EL element 11 emits light corresponding to a potential due to a charge stored in the storage capacitance 18, it is determined whether the pixel 10A or the pixel 10B emits light depending on a level of a light emission control line 26.

One frame is divided into two periods and, for example, the light emission control line 26 is set at a High level in the former half period of one frame, and the light emission control line 26 is set at a Low level in the latter half period of one frame. When the light emission control line 26 is at a High level in the former half period of one frame, the organic EL element 11 in the pixel 10A emits light but the organic EL element 11 in the pixel 10B does not emit light. When the light emission control line 26 is at a Low level in the latter half period of one frame, the organic EL element 11 in the pixel 10B emits light but the organic EL element 11 in the pixel 10A does not emit light. Accordingly, in total one frame, the organic EL elements 11 of all pixels emit light in response to a video signal.

To compare the number of TFTs used in the circuit shown in FIG. 8 and the number of TFTs used in the circuit shown in FIG. 9, the circuit shown in FIG. 8 includes four TFTs per one pixel and the circuit shown in FIG. 9 includes six TFTs per two pixels and hence, the circuit shown in FIG. 9 can reduce one TFT per one pixel. Further, in FIG. 9, the data line 24 and the power source lines 20A, 20B are used in common by the pixels arranged adjacent to each other and hence, the number of data lines 24 and the number of power source lines 20A, 20B can be halved compared to the case shown in FIG. 8 whereby a size of the pixel 10 can be reduced also from this aspect.

FIG. 8 shows the circuit for performing accurate gray-scale display by compensating for the fluctuation of the threshold voltage of the drive TFT 12. A circuit which aims at such accurate gray-scale display is not limited to the circuit shown in FIG. 8 and a large number of circuits can be used for such a purpose. Accordingly, it is needless to say that the present invention is applicable to circuits other than the circuit shown in FIG. 8.

Fourth Embodiment

An organic EL display device adopts the structure which seals a TFT substrate on which an organic EL element 11, drive TFTs 12 and the like are formed using a sealing substrate. Such sealing is provided for preventing the degradation of the organic EL element 11 by moisture. The organic EL display device is classified into a bottom-emission-type display device which takes out emission of light from a TFT substrate side and a top-emission-type display device which takes out emission of light from a sealing substrate side. The present invention is particularly effectively applicable to the bottom-emission-type organic EL display device. This is because, in the bottom-emission-type organic EL display device, when the TFT, the data line 24, the power source line 20 and the like are present, it is difficult to take out the emission of light from the organic EL element 11 to the outside from such portions.

Figure 10:
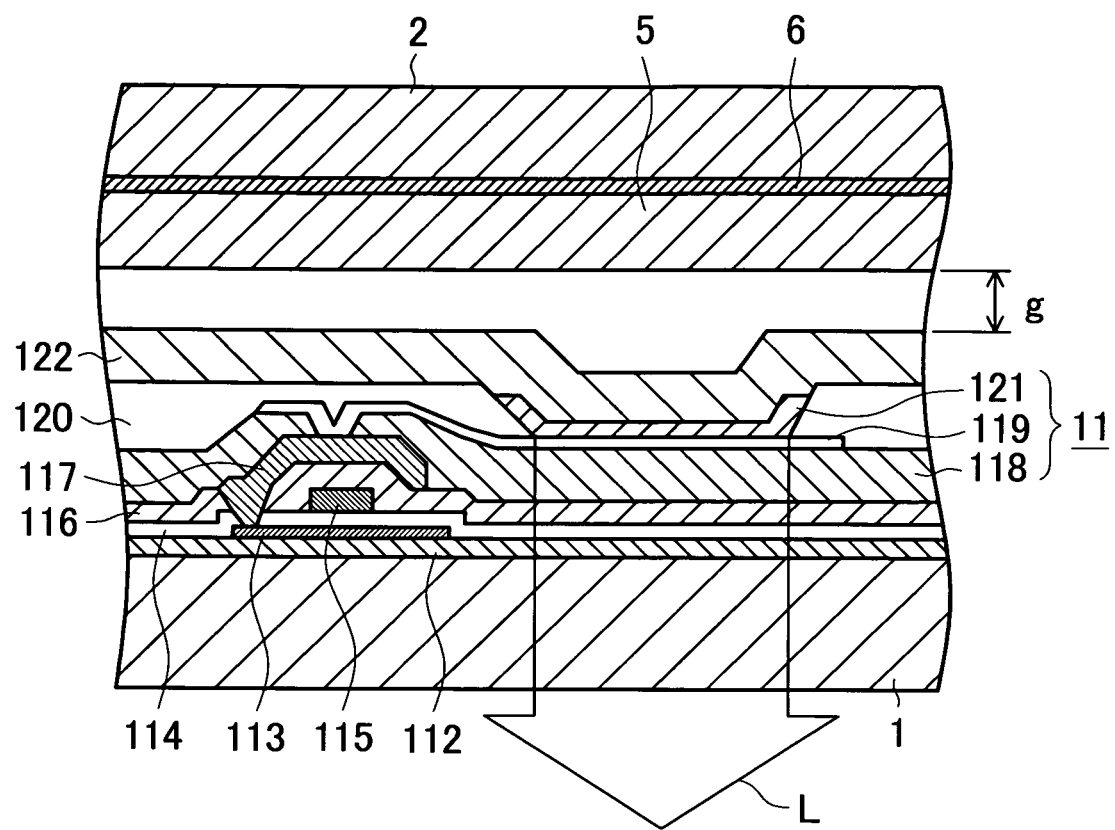
FIG. 10 is a cross-sectional view of a bottom-emission-type organic EL display device.

FIG. 10 is a cross-sectional view of the bottom-emission-type organic EL display device. FIG. 10 shows a portion of the pixel 10, that is, an organic EL element and a TFT in cross section. In FIG. 10, an undercoat 112 is formed on the TFT substrate 1 formed of a glass substrate. The undercoat 112 plays a role of preventing impurities from the glass substrate from contaminating the TFT or an organic EL layer 121.

A semiconductor part 113 is formed of a source portion, a channel portion and a drain portion. A gate insulation film 114 is formed on the undercoat 112 in a state that the gate insulation film 114 covers the semiconductor part 113. A gate electrode 115 is formed on the gate insulation film 114, and an interlayer insulation film 116 is formed on the gate insulation film 114 in a state that the interlayer insulation film 116 covers the gate electrode 115. Although an SD line 117 is formed on the interlayer insulation film 116, the SD line 117 is connected to the source portion or the drain portion formed on the semiconductor layer 113 via a through hole formed in the interlayer insulation film 116 and plays a role of taking out a signal from the TFT. A passivation film 118 for protecting the whole TFT is formed on the interlayer insulation film 116 in a state that the passivation film 118 covers the SD line 117.

Although a transparent electrode ITO which constitutes a lower electrode 119 of the organic EL layer 121 is formed on the passivation film 118, the transparent electrode is connected to the SD line 117 via a through hole formed in the passivation film 118. Further, on the transparent electrode ITO and the passivation film 118, a bank 120 for separating pixels from each other is formed. On portions where the bank 120 is not formed, the organic EL layer 121 which constitutes a light emission part is formed. Further, a metal layer which constitutes an upper electrode 122 is formed over the organic EL layers 121. The metal layer which constitutes the upper electrode 122 is made of Al or an Al alloy and exhibits high reflectance. The organic EL element 11 is constituted of the organic EL layer 121, the lower electrode 119 and the upper electrode 122.

The organic EL layer 121 is, in general, formed of a plurality of layers and emits light when a voltage is applied between a cathode and an anode. Here, the lower electrode 119 is formed of the transparent electrode, and all of the passivation film 118, the interlayer insulation film 116 and the undercoat 112 are also transparent and hence, light emitted from the organic EL layer 121 advances in the direction indicated by an arrow L shown in FIG. 4 (bottom emission). On the other hand, light which advances to the upper electrode 122 is reflected on a metal film which constitutes the upper electrode and also advances in the direction indicated by an arrow L shown in FIG. 4. Here, a desiccant is arranged above the upper electrode 122 with a gap g defined therebetween, and the desiccant is fixed to a counter electrode by an adhesive material such as a pressure sensitive adhesive double-coated tape. The gap g defined between the upper electrode 122 and the desiccant is set to a value which falls within a range from 0.1 mm to 0.2 mm.

In this manner, in the bottom-emission-type organic EL display device, when the TFT or the like is present, it is difficult to take out light emitted from the organic EL element to the outside from the portion where TFT or the like is present. Accordingly, the idea of the present invention which reduces the number of TFTs per one pixel is extremely advantageous in increasing the brightness of the display device. Further, the data line 24, the electric power source line 20 and the like are made of metal for reducing an electric resistance. Accordingly, provided that the number of data line 24 or the number of electric power source line 20 can be reduced, it is possible to increase a quantity of light taken out from the organic EL element 11 to the outside thus increasing the brightness of the organic EL display device.

The invention claimed is:

1. An organic EL display device in which in a display region in which pixels each having an organic EL element are formed in a matrix array, scanning lines for supplying a scanning signal extend in the horizontal direction, and data lines for supplying a video signal and a power source line for supplying an electric current to the organic EL elements extend in the vertical direction, wherein the data lines and the power source lines are used in common by pairs of the pixels arranged adjacent to each other in the horizontal direction, such that a single data line and a single power source line are in common with each of the pairs of pixels, wherein each of the pairs of pixels has a first pixel and a second pixel, the first pixel having a P-type light emission control TFT which determines whether or not an electric current is made to flow into the first pixel, the second pixel having a N-type light emission control TFT which determines whether or not an electric current is made to flow into the second pixel, the display device includes a data signal drive circuit for outputting the video signal via data signal lines the number of which corresponds to the number of pixels in a single horizontal direction in the display region, the data signal lines extending from the data signal drive circuit being configured to connect via emission control elements to the data lines such that the number of the data lines is half of the number of the data signal lines from the data signal drive circuit in the display device, and wherein the emission control element comprises a P-type TFT and a N-type TFT, one of the data signal lines connecting to at least one of a source of the P-type TFT and a source of the N-type TFT of the emission control element, a drain of the P-type TFT and drain of the N-type TFT of the emission control element being combined and connected to one of the data lines, and the P-type light emission control TFT and th P-type TFT of the emission control element are switched simultaneously, and the N-type light emission control TFT an the N-type TFT of the emission control element are switched simultaneously.

2. An organic EL display device according to claim 1, wherein the pixels arranged adjacent to each other in the horizontal direction use a switching TFT for fetching the video signal into the pixel in response to the scanning signal in common.

3. An organic EL display device according to claim 2, wherein the pixels arranged adjacent to each other in the horizontal direction use a drive TFT for controlling a quantity of electric current which is made to flow in the organic EL element and a storage capacitance connected with a gate of the drive TFT and storing a charge therein in response to the video signal in common.

4. An organic EL display device according to claim 1, wherein the scanning lines are selected twice in one frame.

* * * * *